(12) United States Patent
Dong et al.

(10) Patent No.: US 10,591,533 B2
(45) Date of Patent: Mar. 17, 2020

(54) DISPLAY SUBSTRATE, DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xue Dong, Beijing (CN); Lei Ma, Beijing (CN); Hailin Xue, Beijing (CN); Haibo Zhu, Beijing (CN); Yue Li, Beijing (CN); Wenbo Jiang, Beijing (CN); Dong Yang, Beijing (CN); Ming Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 129 days.

(21) Appl. No.: 15/086,657

(22) Filed: Mar. 31, 2016

(65) Prior Publication Data

US 2016/0313392 A1    Oct. 27, 2016

(30) Foreign Application Priority Data

Apr. 21, 2015    (CN) .......................... 2015 1 0190838

(51) Int. Cl.
*G01R 31/28*    (2006.01)
*H01L 27/12*    (2006.01)
(Continued)

(52) U.S. Cl.
CPC ..... *G01R 31/2884* (2013.01); *G01R 31/2818* (2013.01); *H01L 27/124* (2013.01);
(Continued)

(58) Field of Classification Search
CPC ...... G09G 1/00; G09G 2230/00; H01L 21/00; H01L 2221/00; G01N 1/00; G01N 2201/00
See application file for complete search history.

(56) References Cited

U.S. PATENT DOCUMENTS

2002/0113598 A1* 8/2002 Tsuji .................. G01R 31/2805
324/501
2006/0033852 A1* 2/2006 Kim ....................... G09G 3/006
349/38
(Continued)

FOREIGN PATENT DOCUMENTS

| CN | 1548971 A | 11/2004 |
|---|---|---|
| CN | 1822075 A | 8/2006 |
| CN | 101146402 A | 3/2008 |

OTHER PUBLICATIONS

First Office Action dated Nov. 4, 2016 for CN corresponding application 201510190838.6; with English translation.

*Primary Examiner* — Huy Q Phan
*Assistant Examiner* — Temilade S Rhodes-Vivour
(74) *Attorney, Agent, or Firm* — Nath, Goldberg & Meyer; Joshua B. Goldberg; Stanley N. Protigal

(57) ABSTRACT

A display substrate, a display panel including the display substrate and a display device including the display panel are provided. The display substrate comprises a flexible circuit board and test pads, wherein the flexible circuit board covers an area of the test pads. In the aforesaid display substrate, the flexible circuit board covers the area of the test pads, so that test points on the test pads can be prevented from contacting the outside, and corrosion of the test points and signal abnormity in signal lines resulting therefrom during testing are prevented; compared with the prior art, the process of coating the test pads with UV adhesive is omitted, thus the process flow is reduced, and the production effi-
(Continued)

ciency and the productivity are improved; moreover, the thickness of the display substrate can be reduced, which is conducive for the display panel including the display substrate to be lighter and thinner.

11 Claims, 3 Drawing Sheets

(51) Int. Cl.
    *G09G 1/00*     (2006.01)
    *G09G 3/00*     (2006.01)
    *G02F 1/1345*     (2006.01)

(52) U.S. Cl.
    CPC ...... *H01L 27/1218* (2013.01); *G02F 1/13458* (2013.01); *G09G 3/006* (2013.01); *G09G 2300/0426* (2013.01); *G09G 2330/12* (2013.01)

(56) References Cited

U.S. PATENT DOCUMENTS

| | | | | |
|---|---|---|---|---|
| 2007/0046322 A1* | 3/2007 | Jeoung | ................ | G02F 1/13458 324/760.02 |
| 2007/0216846 A1* | 9/2007 | Tseng | ................... | G02F 1/13452 349/149 |
| 2010/0052719 A1* | 3/2010 | Chiu | ..................... | G01R 1/0416 324/760.01 |
| 2010/0157191 A1* | 6/2010 | Jeoung | ................ | G02F 1/13458 349/54 |
| 2011/0037935 A1* | 2/2011 | Tseng | ..................... | G09G 3/006 349/149 |
| 2012/0327056 A1 | 12/2012 | Lee | | |
| 2014/0029230 A1* | 1/2014 | Oh | ........................... | H05K 1/14 361/803 |
| 2015/0062478 A1* | 3/2015 | Zhao | ..................... | G02F 1/1309 349/54 |
| 2015/0201492 A1* | 7/2015 | Kim | ....................... | H05K 1/028 361/749 |
| 2015/0255409 A1* | 9/2015 | Lee | .......................... | H01L 23/60 257/59 |
| 2015/0261050 A1* | 9/2015 | Chen | ................. | G02F 1/134336 349/42 |
| 2015/0279258 A1* | 10/2015 | Shin | ...................... | G09G 3/006 324/755.01 |
| 2016/0172623 A1* | 6/2016 | Lee | ..................... | H01L 51/5253 257/40 |
| 2016/0179229 A1* | 6/2016 | Ahn | ........................ | G06F 3/041 345/173 |

\* cited by examiner

DISPLAY SUBSTRATE, DISPLAY PANEL AND DISPLAY DEVICE

FIELD OF THE INVENTION

The present invention relates to the field of display technology, and specifically relates to a display substrate, a display panel including the display substrate and a display device including the display panel.

BACKGROUND OF THE INVENTION

Generally, after a display panel is manufactured, the display panel needs to be detected to determine whether the display panel has defects or not. In order to facilitate detection, test pads are usually arranged on a display substrate (generally an array substrate), and during detection, test probes are used to contact test points on the test pads, and the test points are connected with signal lines, so that detection signals can be input to the signal lines through the test probes and the test points to detect whether the display panel has defects or not.

FIG. 1 shows a schematic diagram of a display substrate in the prior art, and FIG. 2 shows a schematic diagram of test pads in the display substrate shown in FIG. 1. As shown in FIGS. 1 and 2, a driver chip IC is arranged at a marginal area of the display substrate 1, signal lines for connecting the driver chip IC with pixel units of the display substrate are arranged between the driver chip IC and the pixel units of the display substrate, test pads 2 are arranged on two sides of the driver chip IC, and the test pads 2 are connected with the signal lines. Moreover, a flexible circuit board 3 is further arranged at the edge of the display substrate 1, and the flexible circuit board 3 is used for connecting the display substrate 1 with a printed circuit hoard (not shown in the figures).

In the above display substrate 1, an exposed conductive metal area on each test pad 2 is generally used as a test point, which is easily corroded in the atmospheric environment, and corrosion of the test point can cause signal abnormity in the signal lines and thus can cause damage to the tested display panel. Therefore, after the display panel is detected, the test pads 2 need to be coated with UV adhesive to avoid corrosion of the test points. Obviously, coating the test pads 2 with the UV adhesive can reduce the production efficiency of the display substrate and the display panel including the display substrate, and reduce the productivity, and also, can result in increased thicknesses of the display substrate and the display panel including the display substrate.

SUMMARY OF THE INVENTION

In view of the technical problems in the prior art, an object of the present invention is to provide a display substrate, a display panel including the display substrate and a display device including the display panel, wherein a process of coating test pads of the display substrate with UV adhesive can be omitted, so that the production efficiency and the productivity can be improved and the thicknesses of the display substrate, the display panel including the display substrate and the display device including the display panel can be reduced.

To achieve the above object, the present invention provides a display substrate, including a flexible circuit board and a test pad, wherein the flexible circuit board covers an area of the test pad.

The display substrate may be an array substrate.

A lead may be arranged in the flexible circuit board, one end of the lead is connected with the test pad, and the other end thereof is used for connection with a test probe.

The flexible circuit board may include a test circuit, and the test circuit can be electrically connected with the test pad.

The test pad may be square.

The display substrate may include a plurality of test pads, the plurality of test pads are sequentially arranged in a length direction of the flexible circuit board, and preferably, a length of each test pad in a direction perpendicular to an arrangement direction thereof is equal to a width of the flexible circuit board.

As another technical solution, the present invention further provides a display panel, including the above display substrate provided by the present invention.

As yet another technical solution, the present invention further provides a display device, including the above display panel provided by the present invention.

The present invention has the following beneficial effects.

In the display substrate provided by the present invention, the flexible circuit board covers the area of the test pads, so that test points on the test pads can be prevented from contacting the outside, and corrosion of the test points and signal abnormity in signal lines resulting therefrom during testing are prevented; compared with the prior art, the process of coating the test pads with UV adhesive is omitted, thus the process flow is reduced, and the production efficiency and the productivity are improved; moreover, the thickness of the display substrate can be reduced, which is conducive to implementing a lighter and thinner display panel.

The display panel provided by be present invention adopts the above display substrate provided by the present invention, so that the process of coating the test pads with UV adhesive can be omitted, the process flow is reduced, the production efficiency and the productivity are improved, moreover, the thickness of the display panel can be reduced, which is conducive for the display panel to be lighter and thinner.

The above display panel provided by the present invention is adopted in the display device provided by the present invention, so that the process of coating the test pads with UV adhesive can be omitted, the process flow is reduced, the production efficiency and the productivity are improved, moreover, the thickness of the display device can be reduced, which is conducive for the display device to be lighter and thinner.

BRIEF DESCRIPTION OF THE DRAWINGS

The accompanying drawings are used for providing further understanding of the present invention, constituting a part of the specification, and interpreting the present invention together with specific embodiments below, rather than limiting the present invention. In the drawings.

REFERENCE NUMERALS

1: display substrate; 2: test pad; 3: flexible circuit board; 4: auxiliary flexible circuit board.

DESCRIPTION OF THE PREFERRED EMBODIMENT

The specific embodiments of the present invention will be described in detail below in conjunction with the accompanying drawings. It should be understood that the specific embodiments described herein are merely used for describing and interpreting the present invention, rather than limiting the present invention.

Figure 3:
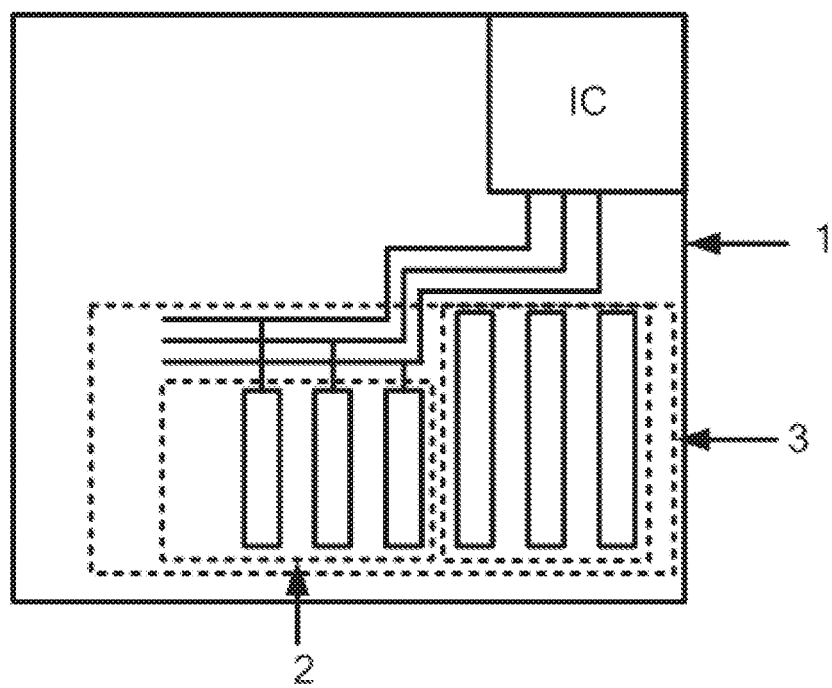
FIG. 3 shows a schematic diagram of a display substrate provided by an embodiment of the present invention.

The present invention provides an embodiment of a display substrate. FIG. 3 is a schematic diagram of a display substrate provided by an embodiment of the present invention. As shown in FIG. 3, the display substrate 1 includes a flexible circuit hoard 3 and test pads 2 in this embodiment, wherein the flexible circuit board 3 covers the area of the test pads 2. Specifically, the display substrate 1 is generally an array substrate.

In manufacture of the display substrate, after thin film transistors, pixel electrodes and signal lines such as gate lines, data lines and the like are manufactured, test probes are brought into contact with test points on the test pads 2, and signals are input to the signal lines to detect whether the display substrate 1 has defects or not. After the detection process is finished, the flexible circuit board 3 is installed on the display substrate 1, and the area of the test pads 2 is covered by the flexible circuit board 3, thus preventing the test points on the test pads from contacting the outside and preventing corrosion of the test points and signal abnormity in the signal lines resulting therefrom during testing. Compared with the prior art, the process of coating the test pads 2 with UV adhesive is omitted, thus the process flow is reduced, the production efficiency and the productivity are improved, moreover, the thickness of the display panel can be reduced, which is conducive to implementing a lighter and thinner display panel.

Preferably, leads (not shown in the figures) may be arranged in the flexible circuit board 3, one end of each lead is connected with a test pad 2, and the other end thereof is used for connection with a test probe. In this case, after the flexible circuit board 3 is arranged on the display substrate 1, the display substrate 1 can also be detected.

Moreover, the flexible circuit board 3 may also include a test circuit, and the test circuit can be electrically connected with the test pads 2. In this case, after the flexible circuit board 3 covers the area of the test pads 2 and the test circuit of the flexible circuit board 3 are electrically connected with the test pads 2, the display substrate 1 can be detected, which is more convenient and more efficient than the above detection mode using the test probes.

Figure 1:
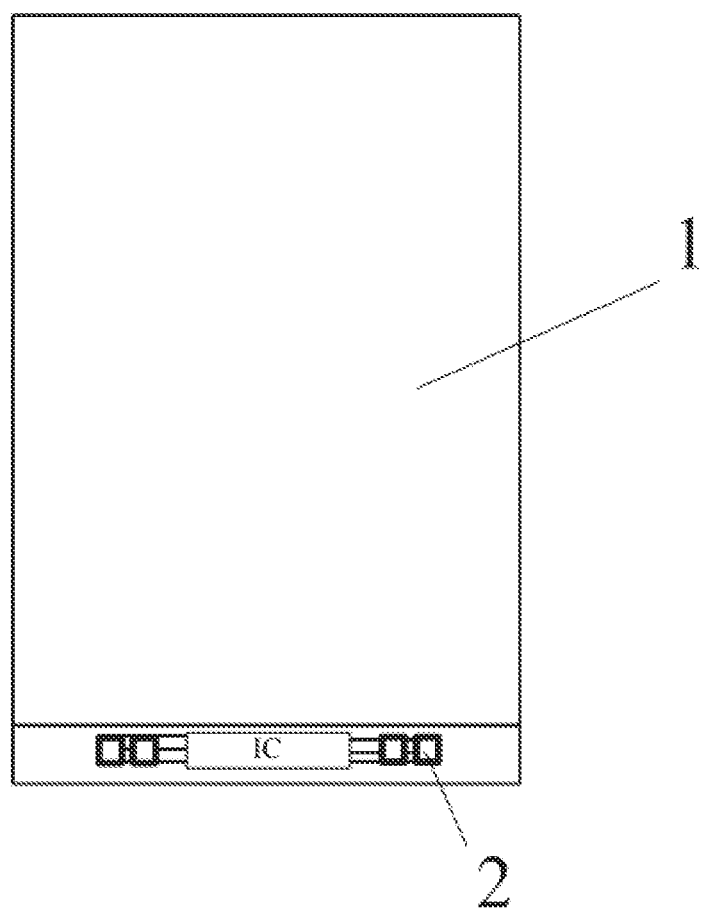
FIG. 1 is a schematic diagram of a display substrate in the prior art.
Figure 2:
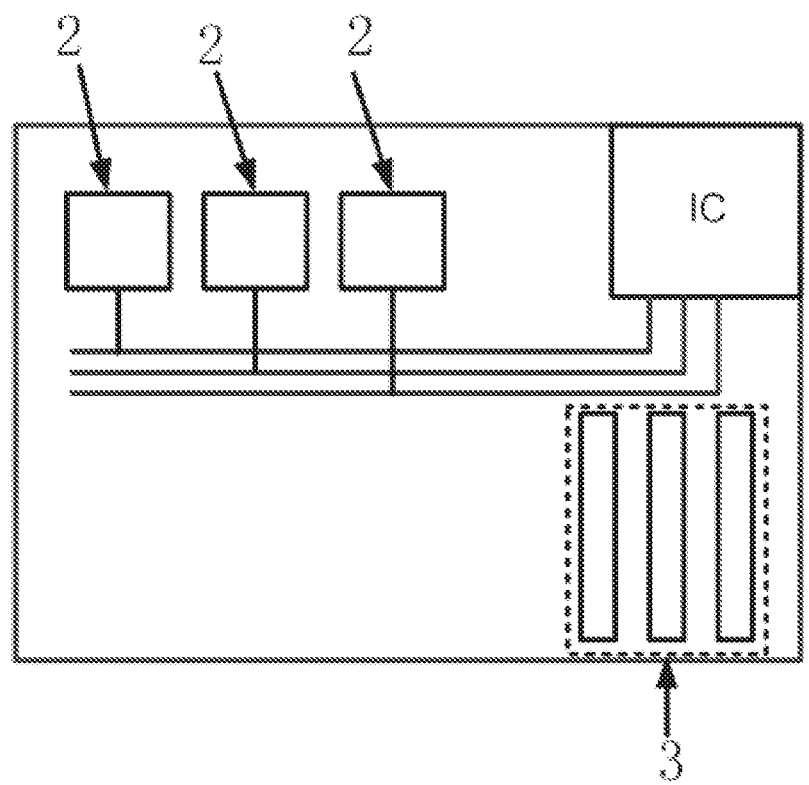
FIG. 2 shows a schematic diagram of test pads in the display substrate shown in FIG. 1.

It can be known by comparing FIG. 2 with FIG. 3 that, in this embodiment, because the flexible circuit board 3 needs to cover the test pads 2, the test pads 2 are moved to a more marginal area of the display substrate 1 and set to be strip-shaped, and the lengths of the test pads 2 are smaller than the width (i.e. the longitudinal size in FIG. 3) of the flexible circuit board 3, in this case, the flexible circuit board has a small area on the basis that the test pads 2 are covered and the connection points of the signal lines with the test pads 2 are covered, which is conducive to implementing a narrow-border display panel.

Figure 4:
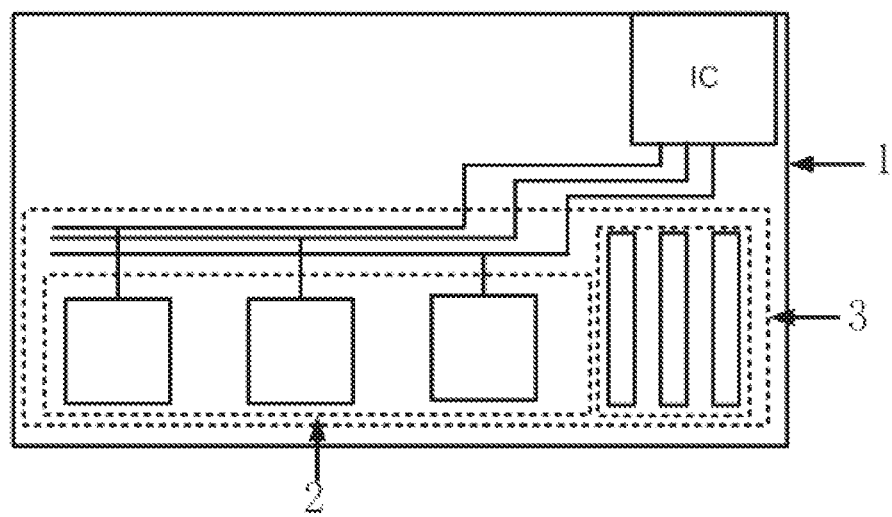
FIG. 4 shows a schematic diagram of a display substrate when test pads are square.

Besides the implementation shown in FIG. 3, the test pads 2 may also be square as shown in FIG. 4, so that under the condition that the lengths (i.e. the longitudinal size in FIG. 4) of the test pads 2 are not changed, the test pads 2 have a large area, so that the detection is facilitated, and more test points can be set in the test pads 2. It could be understood that the test pads 2 are wider in this case as compared with the situation of the test pads 2 as shown in FIG. 3, and consequently, the flexible circuit board 3 needs to be longer (i.e. the transverse size in FIG. 4) in order to cover the test pads 2.

Figure 5:
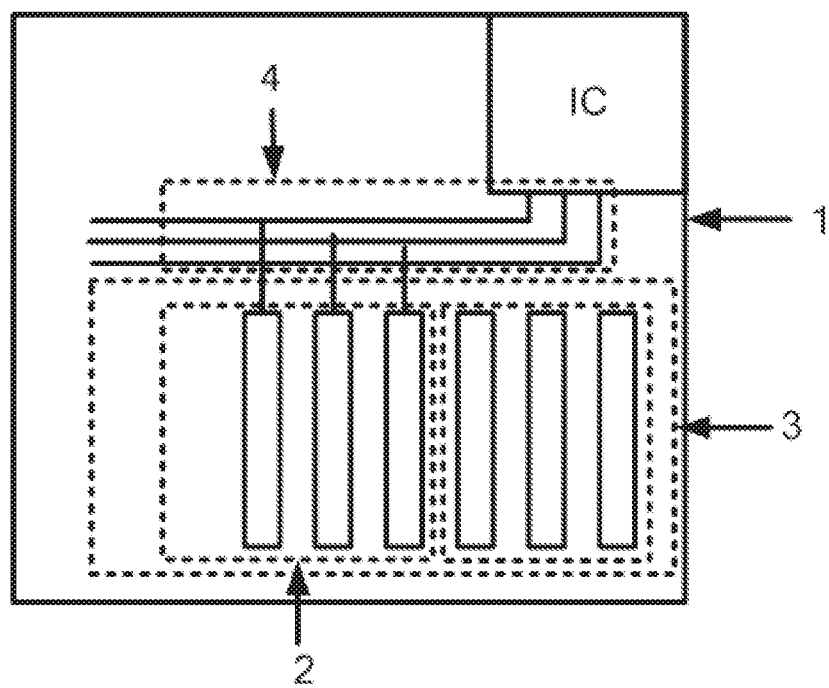
FIG. 5 shows a schematic diagram of a display substrate when the width of test pads is equal to that of a flexible circuit board.

Moreover, also possibly as shown in FIG. 5, the lengths (i.e. the longitudinal size in FIG. 5) of the test pads 2 are equal to the width of the flexible circuit board 3. It is easily understood that, in this case, the flexible circuit board 3 just covers the test pads 2, so an auxiliary flexible circuit board 4 is needed to cover the connection points of the signal lines with the test pads 2 to prevent the signal lines from being corroded. In this case, the area of the test pads 2 is larger as compared with the area of the test pads 2 as shown in FIG. 3, so that the detection is facilitated, and more test points can be set in the test pads 2; and the test pads 2 are narrower as compared with the test pads 2 as shown in FIG. 4, so that the flexible circuit board 3 can be shorter.

In this embodiment, preferably, the display substrate 1 includes a plurality of test pads 2, which may be sequentially arranged in the length direction of the flexible circuit board 3, for example, as shown in FIGS. 3, 4 and 5, the plurality of test pads 2 are sequentially arranged in the transverse direction, so that different areas of a display panel including the display substrate 1 can be conveniently detected and the detection efficiency can also be improved.

In the display substrate 1 provided by this embodiment of the present invention, the flexible circuit board 3 covers the area of the test pads 2, so that the test points on the test pads 2 can be prevented from contacting the outside, and corrosion of the test points and signal abnormity in signal lines resulting therefrom during testing are prevented; compared with the prior art, the process of coating the test pads 2 with UV adhesive is omitted, thus the process flow is reduced, and the production efficiency and the productivity are improved; moreover, the thickness of the display substrate can be reduced, which is conducive to implementing a lighter and thinner display panel.

As another technical solution, the present invention further provides an embodiment of a display panel, wherein the display panel includes the display substrate provided by the above embodiment of the present invention.

In the display panel provided by this embodiment of the present invention, the display substrate provided by the above embodiment of the present invention is adopted, so that the process of coating the test pads with UV adhesive can be omitted, the process flow is reduced, the production efficiency and the productivity are improved, moreover, the thickness of the display panel can be reduced, which is conducive for the display panel to be lighter and thinner.

As another technical solution, the present invention further provides an embodiment of a display device, wherein the display device includes the display panel provided by the above embodiment of the present invention.

In the display device provided by this embodiment of the present invention, the display panel provided by the above embodiment of the present invention is adopted, so that the process of coating the test pads with UV adhesive can be omitted, the process flow is reduced, the production efficiency and the productivity are improved, moreover, the thickness of the display device can be reduced, which is conducive for the display device to be lighter and thinner.

It could be understood that the above embodiments are merely exemplary embodiments adopted for describing the principle of the present invention, but the present invention is not limited thereto. Various variations and improvements may be made for those with ordinary skill in the art without departing from the spirit and essence of the present invention, and these variations and improvements shall also be encompassed within the protection scope of the present invention.

The invention claimed is:

1. A display substrate, comprising a flexible circuit board and a test pad, wherein the flexible circuit board covers the test pad which is configured to detect whether the display substrate has a defect or not,
wherein the display substrate further comprises a plurality of test pads, which are sequentially arranged in a length direction of the flexible circuit board,
and wherein a length of each test pad in a direction perpendicular to an arrangement direction thereof is equal to a width of the flexible circuit board.

2. The display substrate of claim 1, wherein the display substrate is an array substrate.

3. The display substrate of claim 1, wherein a lead is arranged in the flexible circuit board, one end of the lead is connected with the test pad, and the other end thereof is used for connection with a test probe.

4. The display substrate of claim 1, wherein the flexible circuit board comprises a test circuit, and the test circuit is capable of being electrically connected with the test pad.

5. The display substrate of claim 1, wherein the test pad is square.

6. A display panel, comprising the display substrate of claim 1.

7. A display device, comprising a display panel which comprising a display substrate of claim 1.

8. The display device of claim 7, wherein the display substrate is an array substrate.

9. The display device of claim 7, wherein a lead is arranged in the flexible circuit board, one end of the lead is connected with the test pad, and the other end thereof is used for connection with a test probe.

10. The display device of claim 7, wherein the flexible circuit board comprises a test circuit, and the test circuit is capable of being electrically connected with the test pad.

11. The display device of claim 7, wherein the test pad is square.

* * * * *